(12) United States Patent
Wang

(10) Patent No.: US 7,633,115 B2
(45) Date of Patent: Dec. 15, 2009

(54) ELECTRICALLY ERASABLE PROGRAMMABLE READ ONLY MEMORY (EEPROM) CELL

(75) Inventor: Yigong Wang, Rutland, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 410 days.

(21) Appl. No.: 11/550,107

(22) Filed: Oct. 17, 2006

(65) Prior Publication Data

US 2008/0090365 A1  Apr. 17, 2008

(51) Int. Cl.
*H01L 29/788* (2006.01)
(52) U.S. Cl. .............. 257/318; 257/320; 257/E29.3
(58) Field of Classification Search .............. 257/318, 257/320, 322, 379, E29.3
See application file for complete search history.

(56) References Cited

U.S. PATENT DOCUMENTS

| 4,598,460 | A | | 7/1986 | Owens et al. |
| 4,646,425 | A | | 3/1987 | Owens et al. |
| 5,929,495 | A | * | 7/1999 | Dennison et al. ............ 257/392 |
| 6,576,950 | B1 | * | 6/2003 | Cappelletti et al. .......... 257/318 |
| 7,405,442 | B2 | * | 7/2008 | Chen et al. .................. 257/318 |
| 7,452,771 | B2 | * | 11/2008 | Ito et al. ..................... 438/257 |
| 7,463,517 | B2 | * | 12/2008 | Shukuri et al. ......... 365/185.04 |

* cited by examiner

*Primary Examiner*—Mark Prenty
(74) *Attorney, Agent, or Firm*—Daly, Crowley, Mofford & Durkee, LLP

(57) ABSTRACT

Semiconductor structures are adapted to form an electrically erasable programmable read only memory (EEPROM) cell having a long retention life, and/or a reduced programming voltage, and/or a reduced semiconductor real estate, and/or a reduced number of semiconductor fabrication steps.

22 Claims, 8 Drawing Sheets

ELECTRICALLY ERASABLE PROGRAMMABLE READ ONLY MEMORY (EEPROM) CELL

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to non-volatile semiconductor memories and, more particularly, to an electrically erasable programmable read only memory (EEPROM) cell having particular characteristics.

BACKGROUND OF THE INVENTION

Electrically erasable programmable read only memory (EEPROM) memory cells are typically fabricated using double-poly or triple-poly processes that provide two or three layers of polysilicon (poly) material, respectively. For some conventional EEPROM structures, one of the poly layers forms a so-called "floating gate" in which electrons can be stored for long periods of time, even in high temperature applications. The memory cell can be programmed by forcing electrons onto the floating gate, and can be erased by removing electrons from the floating gate.

An EEPROM memory cell can be erased by forcing electrons to migrate away from the floating gate so that it becomes charged with positive ions. This is commonly accomplished by Fowler-Nordheim tunneling using a semiconductor device having a tunnel oxide with a thickness on the order of 70-120 angstroms disposed between a silicon substrate and the floating gate. A relatively strong electric field (e.g., greater than 10 mV/cm) is applied across the gate oxide, causing electrons to tunnel from the floating gate toward the underlying source, drain, or channel region of the semiconductor device, thereby removing electrons from the floating gate. This technique is described in greater detail, for example, in U.S. Pat. Nos. 5,792,670, 5,402,371, 5,284,784 and 5,445,792, each of which is incorporated herein by reference in its entirety.

Fowler-Nordheim tunneling can also be used to program an EEPROM memory cell by forcing electrons to tunnel into the floating gate so that it becomes charged negatively. U.S. Pat. Nos. 5,792,670 and 5,402,371, each of which is incorporated by reference herein in its entirety, describe examples in which electrons are forced to tunnel into the floating gate from a channel region beneath it.

Another way to program an EEPROM memory cell is by using hot carrier injection. In hot carrier injections, during a programming operation, electrons flowing from a source to a drain of a metal oxide silicon (MOS) transistor are accelerated by a high electric field across a channel region adjacent to an oxide layer, adjacent to the floating gate. Some of the accelerated electrons become heated near the drain junction, becoming so-called "hot electrons." Some of the hot electrons exceed the oxide barrier height and are injected into the floating gate. This technique is described in greater detail in U.S. Pat. No. 4,698,787, which is incorporated by reference herein in its entirety.

As described above, some conventional electrically erasable programmable read only memory (EEPROM) cells have a polysilicon floating gate. These memory cells typically comprise two or three layers of polysilicon. A first polysilicon layer is conventionally used as the floating gate, which forms a part of a so-called "programming capacitor." The second polysilicon layer is conventionally used as a control gate to control the memory cell.

Conventional EEPROM memory cells typically comprise at least two transistors coupled to the programming capacitor. One transistor is adapted to "program" the programming capacitor, i.e., to force electrons into the programming capacitor floating gate. The other transistor is adapted to "sense" the electrons stored in the programming capacitor. The two transistors are conventionally coupled to the programming capacitor with deposited metal couplings.

Conventional EEPROM cells also typically comprise an erase capacitor coupled to the programming capacitor. The erase capacitor is formed from a plurality of polysilicon layers, and is operable to remove stored electrical charge from the common floating gate.

A variety of semiconductor processes can be used to fabricate conventional EEPROM memory cells, including, but not limited to, a CMOS process and a BiCMOS process. However, other processes can also be used.

Performance of EEPROM cells can be characterized by a variety of performance parameters, including, but not limited to, a programming voltage, an erasing voltage, a programming time, an erasing time, a number of write/erase cycles, and a holding time (typically specified at high temperatures (data retention), such as 150 C or 200 C). In general, lower programming voltages, faster programming times, higher numbers of write/erase cycles, and longer data retention are desirable.

EEPROM cells can be further characterized in terms of ease of fabrication, which may be associated with the number of processing steps required to form the EERPROM cell. EEPROM cells can be still further characterized in terms of required substrate area. Ease of fabrication and substrate area are often closely related to the cost of the EEPROM cell.

SUMMARY OF THE INVENTION

The present invention provides an electrically erasable programmable read only memory (EEPROM) cell having good performance characteristics and having physical characteristics that tend to make a low cost memory cell.

In accordance with the present invention, an electrically erasable programmable read only (EEPROM) memory cell includes a programming capacitor disposed on a substrate. The programming capacitor includes a capacitor deposited polysilicon layer disposed over an implanted P-well region. A contact structure is coupled to the implanted P-well region. The contact structure includes an implanted P-minus region coupled to the implanted P-well region, an implanted P-plus region coupled to the implanted P-minus region, and an implanted N-plus region coupled to the implanted P-plus region.

In accordance with another aspect of the present invention, an electrically erasable programmable read only (EEPROM) memory cell includes a programming capacitor disposed on a substrate. The memory cell also includes an NMOS transistor disposed on the substrate and coupled to the programming capacitor. The NMOS transistor includes a transistor implanted P-minus region disposed in at least a gate region of the NMOS transistor.

In accordance with another aspect of the present invention, an electrically erasable programmable read only (EEPROM) memory cell includes a programming capacitor disposed on a substrate. The programming capacitor includes a programming capacitor deposited polysilicon layer and a field oxide layer, wherein the programming capacitor deposited polysilicon layer overlaps the field oxide layer.

In accordance with another aspect of the present invention, an electrically erasable programmable read only (EEPROM) memory cell includes a programming capacitor disposed on a substrate and comprising a programming capacitor deposited polysilicon layer. The memory cell also includes an NMOS transistor disposed on the substrate and coupled to the programming capacitor, wherein the NMOS transistor includes a transistor deposited polysilicon layer. The memory cell also includes a polysilicon link coupling the programming capacitor deposited polysilicon layer with the transistor deposited polysilicon layer, wherein the programming capacitor deposited polysilicon layer is conjoined with the transistor deposited polysilicon layer by way of the polysilicon link in a single contiguous layer of polysilicon material.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "P-well" is used to describe a P-type doping, which can be implanted in a semiconductor, and which has a doping concentration of approximately $3 \times 10^{16}$ ions/cm$^3$. Similarly, as used herein, the term "N-well" is used to describe an N-type doping, which has a doping concentration of approximately $2.5 \times 10^{16}$ ions/cm$^3$.

As used herein, the terms "P–" or "P-minus" are used to describe a P-type doping, which can be implanted in a semiconductor, and which has a doping concentration of approximately $10^{17}$ ions/cm$^3$.

As used herein, the terms "P+" or "P-plus" are used to describe a P-type doping, which can be implanted in a semiconductor, and which has a doping concentration of approximately $3 \times 10^{19}$ ions/cm$^3$. Similarly, as used herein, the terms "N+" or "N-plus" are used to describe an N-type doping, which has a doping concentration of approximately $10^{20}$ ions/cm$^3$.

As used herein, the terms "P-type barrier layer" of "PBL" are used to describe a P-type doping, which can be implanted in a semiconductor, and which has a doping concentration of approximately $2 \times 10^{17}$ ions/cm$^3$. As used herein, the terms "N-type barrier layer" or "NBL" are used to describe an N-type doping, which has a doping concentration of approximately $1 \times 10^{19}$ ions/cm$^3$.

As used herein, the terms "N-epi" or simply "epi" are used to describe a semiconductor layer having an N-type doping, disposed over all of or a substantial portion of a semiconductor substrate. The N-epi layer is "grown" on the semiconductor substrate, and has a doping concentration of approximately $2 \times 10^{15}$ ions/cm$^3$.

As used herein, the terms "lightly-doped drain" or simply "LDD" are used to describe a semiconductor layer having a doping, in the drain or in the source region of a metal oxide semiconductor (MOS) transistor. The LDD described herein is doped with N-type elements. The LDD layer can be implanted in the semiconductor, and has a doping concentration of approximately $1 \times 10^{17}$ ions/cm$^3$.

As used herein, the terms "polysilicon" or simply "poly" are used to describe a poly-crystalline semiconductor layer, which can be used, for example, as a conductive gate material in MOSFET and CMOS processing technologies. The poly layer can be deposited, for example, using low-pressure chemical vapor deposition (LPCVD) techniques. The poly layer can also be formed using other techniques. The poly layer can be heavily doped with N-type or P-type doping, and has a doping concentration of approximately $3 \times 10^{20}$ ions/cm$^3$. The poly layer described herein is doped with N-type ions.

Figure 1:
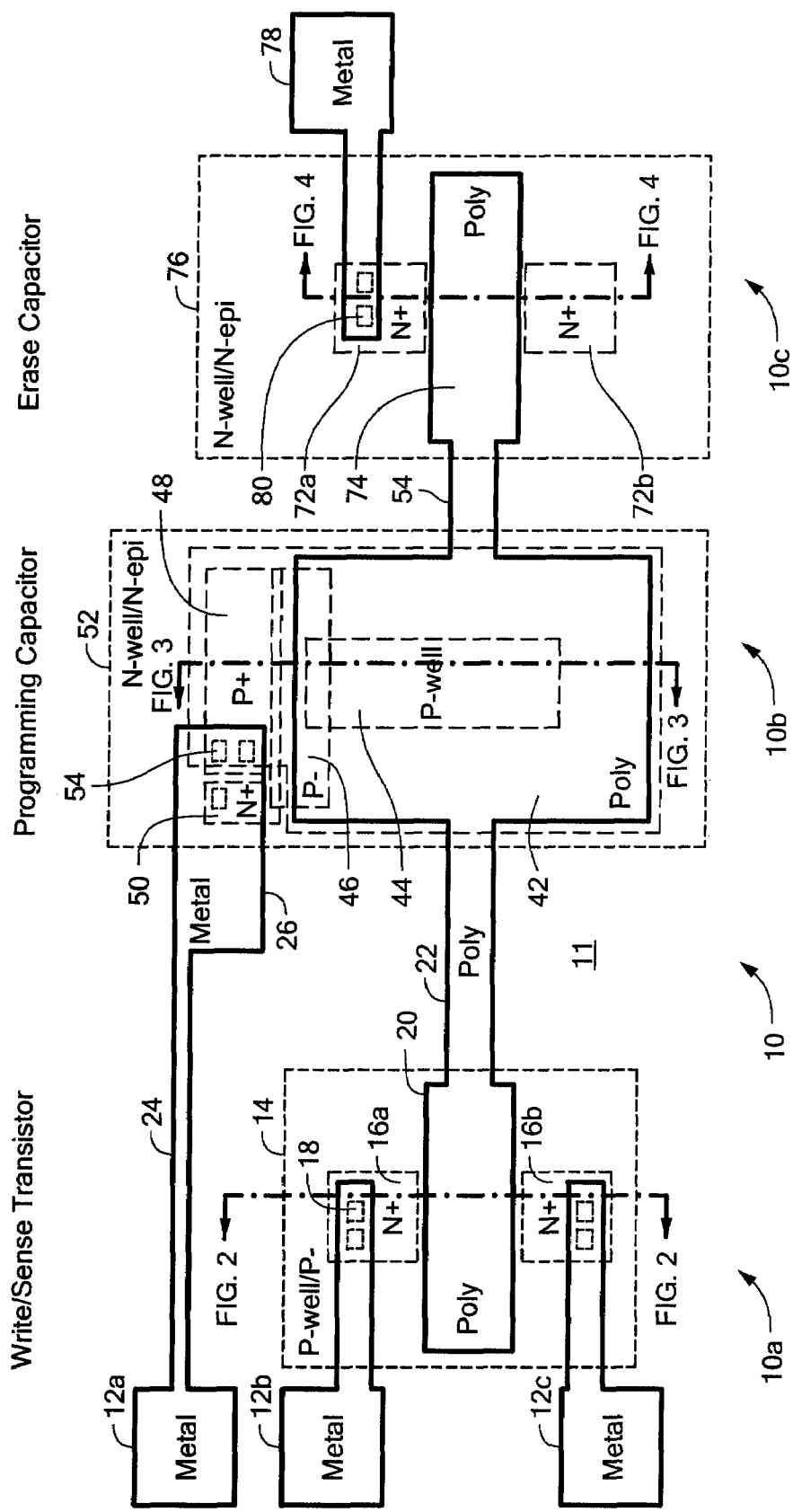
FIG. 1 is a block diagram showing a top view of an electrically erasable programmable read only memory (EEPROM) memory cell in accordance with the present invention, having a write/sense transistor, a programming capacitor, a contact structure, and an erase capacitor.

Referring to FIG. 1, an exemplary EEPROM cell 10 includes a write/sense transistor 10a (an NMOS transistor), a programming capacitor 10b, and an erase capacitor 10c, coupled as shown on a common substrate 11. Some features of the write/sense transistor 10a, the programming capacitor 10b, and the erase capacitor 10c are more fully described below in conjunction with cross-sectional views shown in FIGS. 2, 3, and 4, respectively.

The write/sense transistor 10a includes a P-well region 14 implanted into the substrate 11, and a P-minus region 14 implanted into the P-well region 14, forming a P-well/P-minus region 14, which denotes a composite structure rather than an ion concentration. The write/sense transistor 10a can also include two N+ regions 16a, 16b implanted into the P-well/P-minus region 14. The two N+ regions 16a, 16b are self-aligned to be generally beneath and juxtaposed with a polysilicon layer 20 (transistor deposited polysilicon layer), disposed over the P-well/P-minus region 14.

As used for clarity herein, the term "region" is used to describe portions of a semiconductor device that are implanted (or otherwise disposed) beneath a surface, e.g., a surface of a silicon substrate. Conversely, as used herein, the term "layer" is used to describe portions of a semiconductor device that are grown or deposited (or otherwise disposed) above a surface, e.g., a surface of a silicon substrate.

Metal contact pads 12b, 12c couple to the two N+ region through vias, of which a via 18 is but one example. It will be appreciated that the two metal contact pads 12b, 12c can be coupled with bond wires (not shown) or the like to an integrated circuit lead frame (not shown).

The write/sense transistor 10a is coupled to the programming capacitor 10b through a polysilicon link 22. The programming capacitor 10b is surrounded by an N-epi boundary layer 52 grown on the substrate 11 and an N-epi layer 52 implanted into the N-epi layer 52, forming an N-well/N-epi region 52, which denotes a composite structure rather than an ion concentration. The programming capacitor 10b includes a P-well region 44 implanted into the substrate 11. The P-well region 44 is disposed generally beneath a polysilicon layer 42 (programming capacitor deposited polysilicon layer) disposed over the P-well region 44. The poly layer 42 is conjoined with the poly layer 14 in a single contiguous layer of polysilicon material by way of the poly link 22. The contiguous layer of polysilicon material forms the "floating gate," in which electrons are stored during programming and from which electrons are removed during erasing.

A contact structure coupled to the P-well region 44 includes a P− region 46 coupled to the P-well region 44, a P+ region 48 coupled to the P− region 46, and an N+ region 50 coupled to the P+ region 48. The coupling structure is described more fully below in conjunction with FIG. 1A.

The programming capacitor 10b can also include another contact structure formed by the polysilicon link 22. The P-well region 44, the P-minus region 46, and the P+ region 48, are implanted into the substrate 11, or more precisely, into an N-epi layer deposited on the substrate 11, as will be more apparent from the discussion below in conjunction with FIG. 3. The N-plus region 50 is implanted into the N-well/N-epi region 52.

A metal contact pad 12a couples to the N+ region 50 and/or to the P+ region 48, by way of vias, of which a via 54 is but one example.

The programming capacitor 10b is coupled to an erase capacitor 10c with another poly link 54. The erase capacitor 10c includes an N-epi layer 76 implanted into the substrate 11 and an N-well region 76 implanted into the N-epi layer 76, forming an N-well/N-epi region 76. The N-well region 76 is generally beneath a polysilicon layer 74 (erase capacitor deposited polysilicon layer) disposed over the N-well region 76. The poly layer 74 can be conjoined with the poly layer 52 and with the poly layer 14 in a single contiguous layer of polysilicon material by way of the poly link 54 and the poly link 22. As described above, the contiguous layer of polysilicon material forms the "floating gate," in which electrons are stored during programming and from which electrons are removed during erasing.

The erase capacitor can also include two N+ regions 72a, 72b implanted into the N-well/N-epi region 76 beneath and juxtaposed with the poly layer 74.

A metal contact pad 78 can be coupled to the N+ region 72a with vias, of which a via 80 is but one example. In operation, in order to program the EEPROM cell 10, a constant current is applied to the metal contact pad 12b (Drain), the metal contact pad 12c (Source/Body) is grounded, and a voltage pulse is applied at the metal contact pad 12a (PG Cap or Common gate). Under these conditions, hot electrons are generated in the channel region (i.e., under the poly layer 20), which tunnel through the gate oxide (approximately 200 angstroms thick), and which enter the common floating gate which contains the poly layer 20, the poly layer 42, and the poly link 22. Thus, the hot electrons are stored in the floating gate (For reasons described below, the programming can be accomplished with a programming voltage (i.e., a voltage pulse magnitude) of approximately twelve volts.

In order to erase the programming capacitor 10b, a voltage pulse is applied at the metal contact pad 78, with the metal contact pad 12a grounded. Under these conditions, electrons stored on the floating gate (poly layer 42) tunnel out of the floating gate.

The NMOS transistor 10a can be used to sense (i.e., to read) the EEPROM cell 10. To this end, the NMOS transistor 10a can be coupled to other circuitry (not shown) adapted to measure a "threshold voltage" (Vth) of the NMOS transistor 10a before and after each programming/erasing action. The shift of Vth is an indicator of the effect and result of a programming/erasing action. The metal contact pad 12a can serve as a gate during the Vth measurement.

Figure 1A:
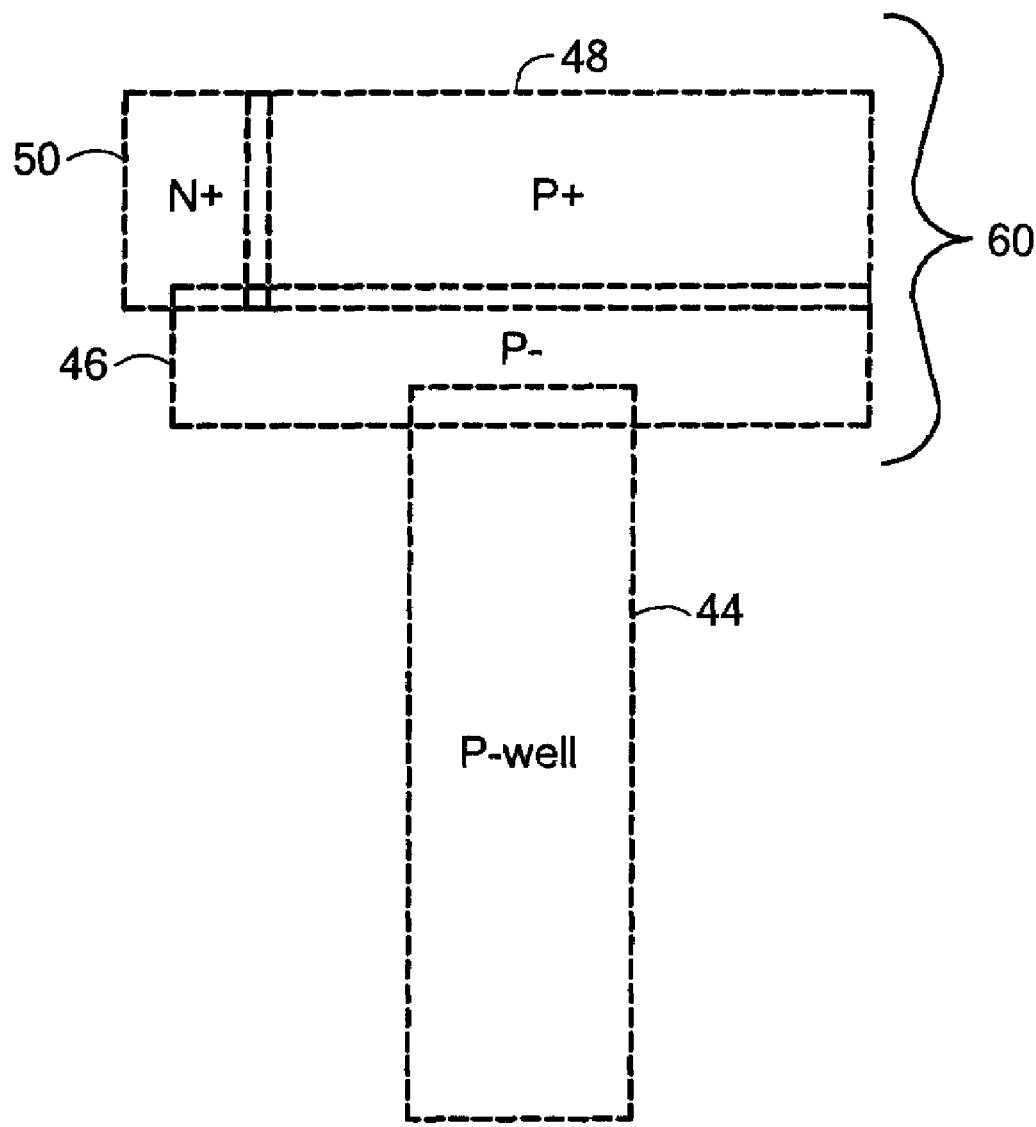
FIG. 1A is a block diagram showing a portion of the top view of a contact structure of FIG. 1.

Referring now to FIG. 1A, in which like elements of FIG. 1 are shown having like reference designations, a contact structure 60 can be coupled to the P-well region 44 of FIG. 1. The contact structure 60 includes the P− region 46, coupled to the P+ region 48, which is coupled to the N+ region 50.

The contact structure 60 ensure good programming performance by having a portion of the P-plus region 48 in the contact region 60 and a portion of the lightly doped P-Well region 44 in the "capacitor region" (i.e., under the poly layer 42 of FIG. 1). As shown, the P-plus region 48 and the P-Well region 44 are connected by the medium doped P-minus region 46.

As will be better understood from discussion below in conjunction with FIGS. 2 and 3, the NMOS transistor 10a and programming capacitor 10b from a "folded" Si/gate oxide/poly/gate oxide/Si structure. In programming operation, hot electrons created in the channel region between the two N-plus regions 16a, 16b of the NMOS transistor 10a (FIG. 1) are at one side of the folded Si/gate oxide/poly/gate oxide/Si structure, and P-type dopants (i.e., elements 44, 60 of FIG. 1A)) are on the other side. The P-type dopants can attract more electrons, which can move toward the MOS barriers where they become "hot" and tunnel through the barriers. Using the P-well region 44 in the capacitor region (i.e., under the poly layer 42 of FIG. 1) rather than using the P-plus region 46 in the capacitor region, tends to provide better data retention.

Figure 2:
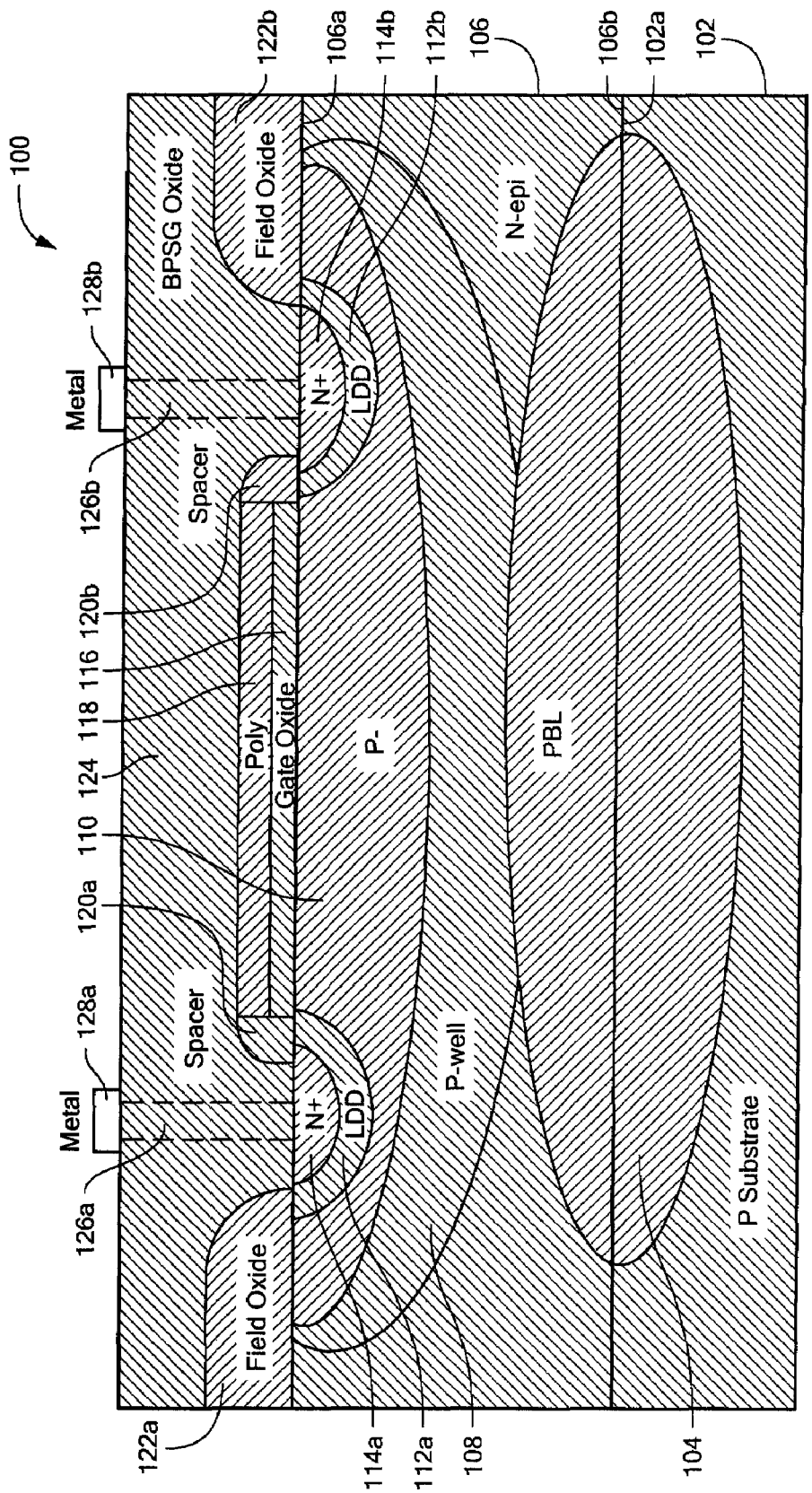
FIG. 2 is a cross section showing the write/sense transistor of FIG. 1.

Referring now to FIG. 2, a write/sense transistor 100, which can be an NMOS transistor, can be the same as or similar to the write/sense transistor 10a of FIG. 1. Shown in cross section, the write/sense transistor 100 can be formed on a P-type substrate 102. A P-type barrier layer (PBL) region 104 can be implanted into the substrate 102, and can extend both upward and downward from a surface 102a of the substrate 102. An N-epi layer 106 can be grown on the surface 102a of the substrate 102. A P-well region 108 can be implanted in the N-epi layer 104 and can merge with the PBL region 104, which can be diffused upward into the N-epi layer 106. A P-minus region 110 can be implanted in the P-well region 104. Two N-type LDD regions 112a, 112b are implanted into the P-minus region 110, and two respective N-plus regions 114a, 114b are implanted into the two LDD regions 112a, 112b, forming a drain/source arrangement of the NMOS write/sense transistor 100. It will be recognized that the P-minus region 110 can extend beyond a gate region of the write/sense transistor 100, i.e., between the drain/source formed by the two N-plus regions 114a, 114b. However, in other arrangements, the P-minus regions 110 can extend only within the gate region.

The P-minus region 110 tends to result in a lower required programming voltage. Whereas a conventional EEPROM memory cell with similar device structure, requires a programming voltage of approximately eighteen volts the EEPROM memory cell 10 of FIG. 1 requires a lower programming voltage, for example, twelve volts.

The write/sense transistor 100 can also include a gate oxide layer 116, formed on a surface 106a of the N-epi layer 106. A polysilicon layer 118 can be formed on the gate oxide layer 116. Oxide spacers 120a, 120b, which can be deposited on the surface 106a of the N-epi layer 106, generally surround the gate oxide layer 116 and the polysilicon layer 118. Field oxide 122a, 122b can be grown on the surface 106a of the N-epi layer 106, generally outside of the area occupied by the write/sense transistor 100. A Boron-phosphosilicate glass (BPSG) oxide layer 124 can be deposited over the surface of the write/sense transistor 100. Vias 126a, 126b are etched into the BPSG oxide payer 124, and metalization can be deposited in the vias 126a, 126b, which couple metal contacts 128a, 128b to the N-plus regions 114a, 114b, respectively.

Figure 3:
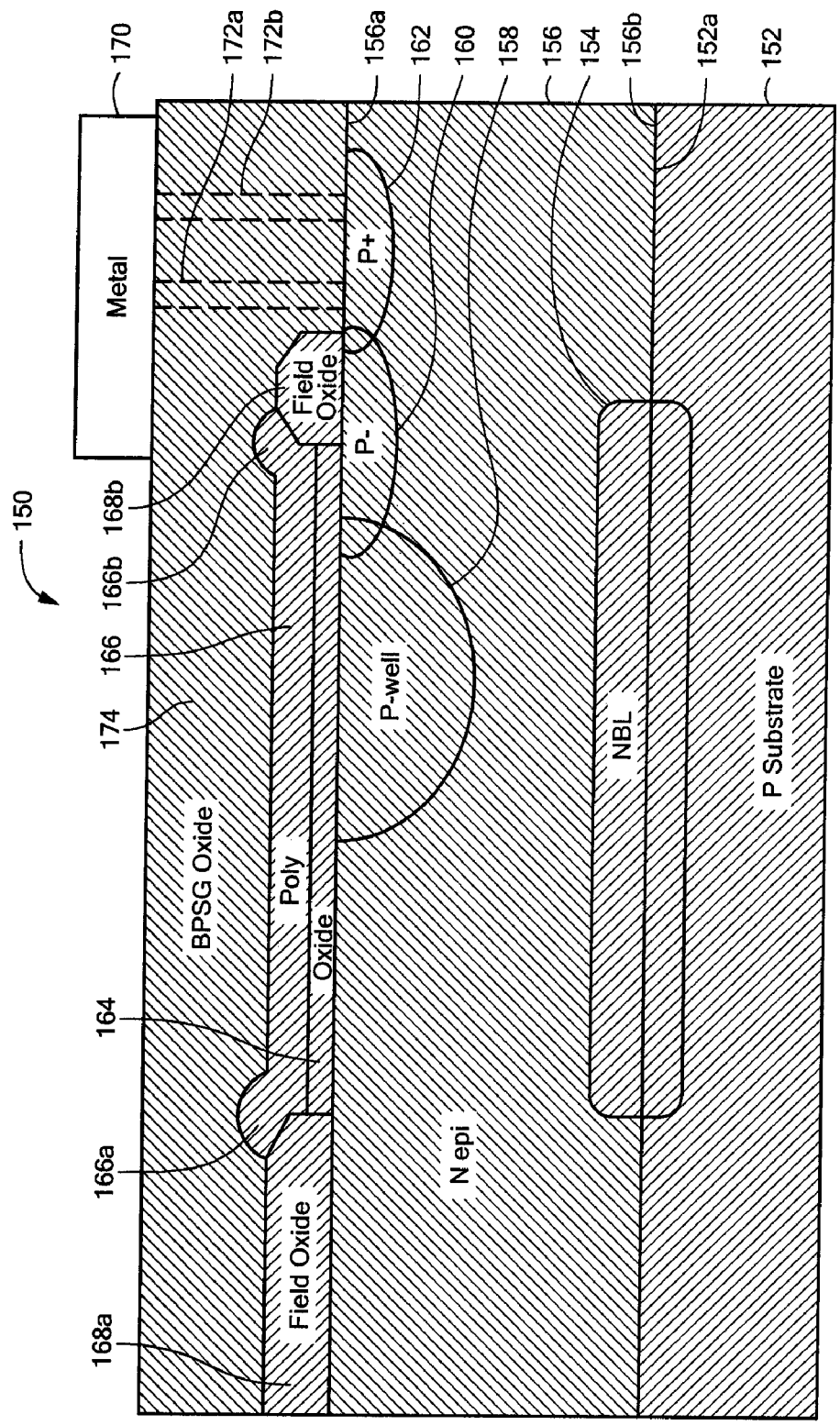
FIG. 3 is a cross section showing the programming capacitor of FIG. 1.
Figure 4:
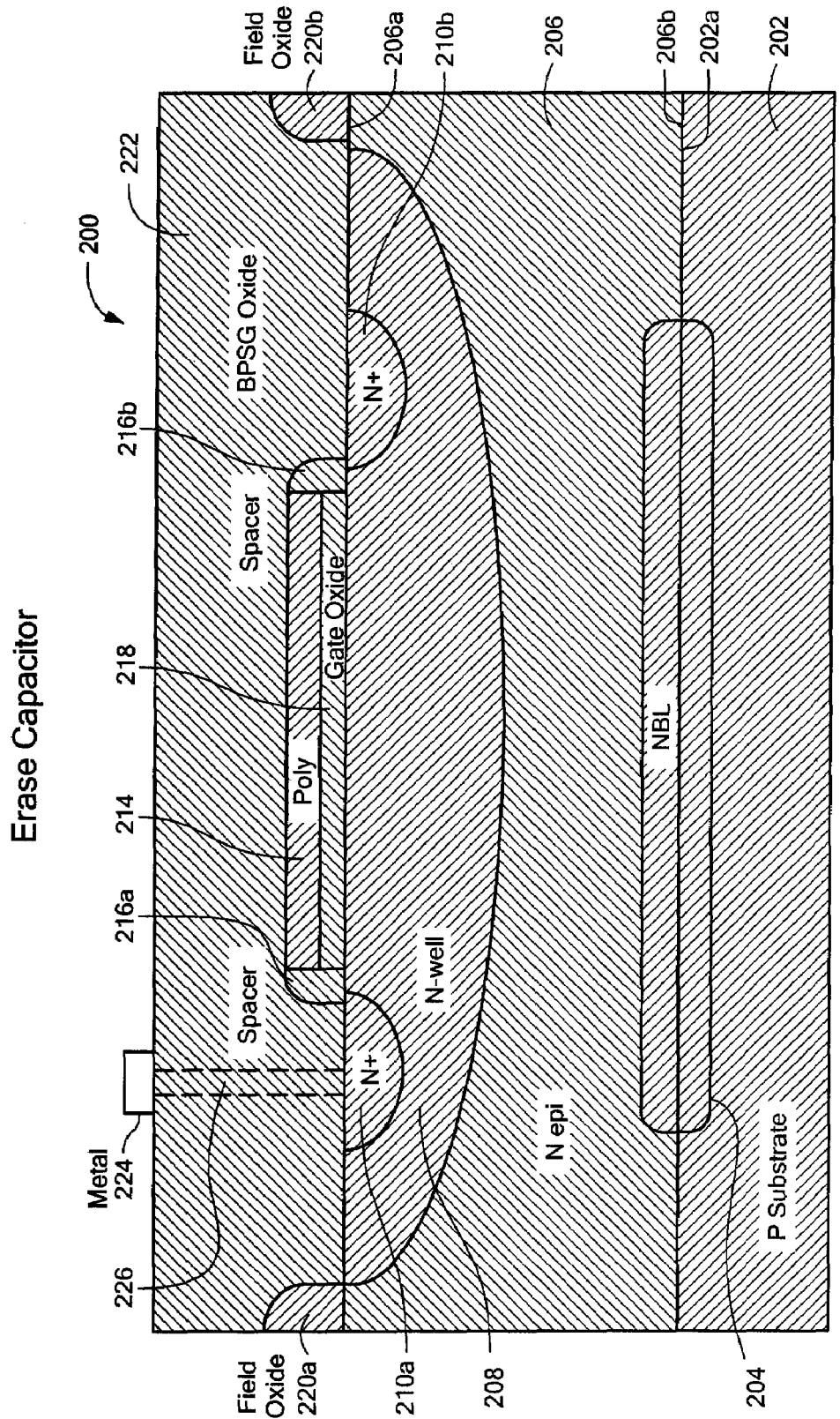
FIG. 4 is a cross section showing the erase capacitor of FIG. 1.

It should be recognized that various dimension of the elements of FIGS. 2-4 are drawn out of scale for clarity. In some embodiments, the PBL region 104 is about five to six micrometers thick top to bottom after both up and down diffusions, the spacers 120a, 120b are about two thousand nine hundred fifty angstroms thick, the field oxide layer 122a, 122b is about seven thousand angstroms thick, the gate oxide layer 116 is about two hundred angstroms thick, the poly layer 118 is about two thousand seven hundred fifty angstroms thick, the BPSG oxide layer 124 is about four thousand five hundred angstroms thick, the N-epi layer 106 is about eighth and a half micrometers thick, the P-well region 108 is about two micrometers deep, the P-minus region 110 is about 0.75 micrometers deep, and the metal pads 128a, 128b are about five thousand angstroms thick. Similar layers and regions of FIGS. 3 and 4 have similar thicknesses will be apparent below in FIGS. 3 and 4.

Referring now to FIG. 3, a programming capacitor 150 can be the same as or similar to the programming capacitor 10b of FIG. 1. Shown in cross section, the programming capacitor 150 can be formed on a P-type substrate 152. An N-type barrier layer (NBL) region 154 can be implanted into the substrate 152, and can extend both upward and downward from a surface 152a of the substrate 152. An N-epi layer 156 can be grown on the surface 152a of the substrate 152. A P-well region 158 can be implanted in the N-epi layer 156. A P-minus region 160, coupled to the P-well region 158, can be implanted in the N-epi layer 156. A P-plus region 162, coupled to the P-minus region 160, can be, also implanted in the N-epi layer 156. An N-plus region (e.g., the N-plus region 50 of FIG. 1) is not visible in this view.

The programming capacitor 150 can also include an oxide layer 164, formed on a surface 156a of the N-epi layer 156. A polysilicon layer 166 can be formed on the gate oxide layer 164. Field oxide 168a, 168b can be grown on the surface 156a of the N-epi layer 156, generally outside of the area occupied by the oxide layer 166 and poly layer 166. A BPSG oxide layer 174 can be deposited over the programming capacitor 150. Vias 172a, 172b are etched into the BPSG oxide layer 124, and metalization can be deposited in the vias 172a, 172b, coupling a metal contact 170 to the P-plus region 162 (and N-plus region 50 of FIG. 1).

In some embodiments, the poly layer 166 overlaps (i.e., directly contacts, surface to surface) the field oxide layer 168a, 168b at overlaps 166a, 166b, which can be representative of a substantially continuous overlaps about an edge of the poly layer (e.g., the poly layer 42 of FIG. 1). The overlap provides an improved isolation of the poly layer 166 (floating gate) from the implanted P-well region 158 and from other implanted regions, resulting in a longer retention time in which the poly layer 166 can retain electrons. In some embodiments, the poly layer 166 overlaps the field oxide layer 168a, 168b by about one micrometer.

The P-well region 158, the P-minus region 160, and the P-plus region 162, are the same as or similar to the P-well regions 44, the P-minus region 46, and the P-plus region 48 of FIGS. 1 and 1A. The P-minus region 160, the P-plus region 162, and also an N-plus region, which is not shown (e.g., 50 of FIGS. 1 and 1A), form a contact structure, to couple the P-well region 44 to the metallization 170.

The above described contact structure and the above described overlaps 166a, 166b, result in the programming capacitor 150 that can hold (i.e., store) a logic state (electrons), for over 10 years (e.g., at 150 C). This is because the overlaps 166a, 166b shield the edges of the oxide layer 164 from escape of electrons.

As described above, it should be recognized that various dimension of the elements of FIG. 3 are drawn out of scale for clarity. However, as will be apparent from the discussion in FIGS. 5-7, most of the layers and regions of FIG. 3 are generated at the same processing step as similar layers and regions of FIG. 2, and therefore, have the same or similar thickness. In some embodiments, the P-plus region is about 0.3 micrometers deep.

Referring now to FIG. 4, an erase capacitor 200 can be the same as or similar to the erase capacitor 10c of FIG. 1. Shown in cross section, the erase capacitor 200 can be formed on a P-type substrate 202. An N-type barrier layer (NBL) region 204 can be implanted into the substrate 202, and can extend both upward and downward from a surface 202a of the substrate 202. An N-epi layer 206 can be grown on the surface 202a of the substrate 202. Two N-plus regions 210a, 210b are implanted in the N-well region 208.

The erase capacitor 200 can also include an oxide layer 218, formed on a surface 206a of the N-epi layer 206. A polysilicon layer 214 can be formed on the oxide layer 218. Oxide spacers 216a, 216b, which can be deposited on the surface 206a of the N-epi layer 206, generally surround the oxide layer 218 and the polysilicon layer 214. Field oxide 220a, 220b can be grown on the surface 106a of the N-epi layer 106, generally outside of the area occupied by the erase capacitor 200. A BPSG oxide layer 222 can be deposited over the surface of the erase capacitor 200. A via 226 can be etched into the BPSG oxide layer 222, and metalization can be deposited in the via 226, which couples a metal contact pad 224 to the N-plus region 210a.

As described above, it should be recognized that various dimension of the elements of FIG. 4 are drawn out of scale for clarity. However, as will be apparent from the discussion in FIGS. 5-7, most of the layers and regions of FIG. 4 are generated at the same processing step as similar layers and regions of FIG. 2, and therefore, have the same or similar thickness. In some embodiments, the N-well region 208 is about two micrometers deep.

Figure 5:
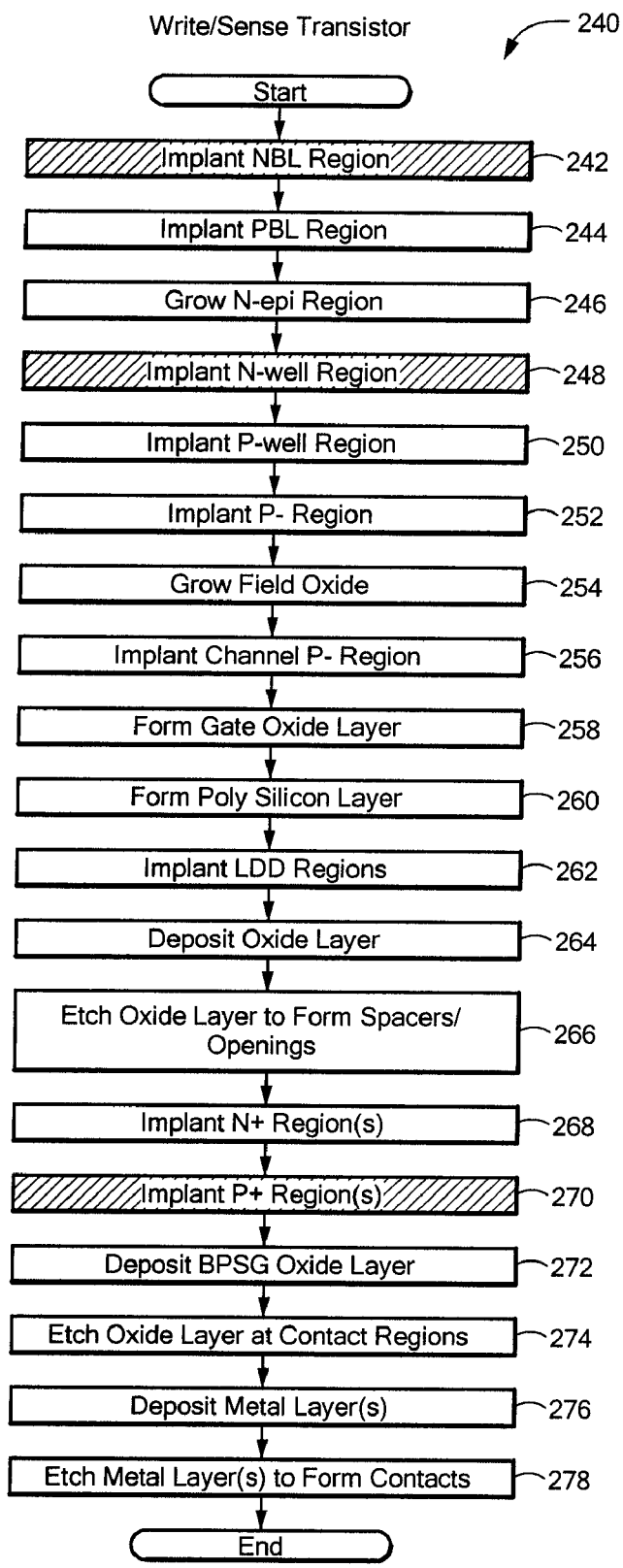
FIG. 5 is a flow chart showing a process of forming the write/sense transistor of FIG. 1.
Figure 6:
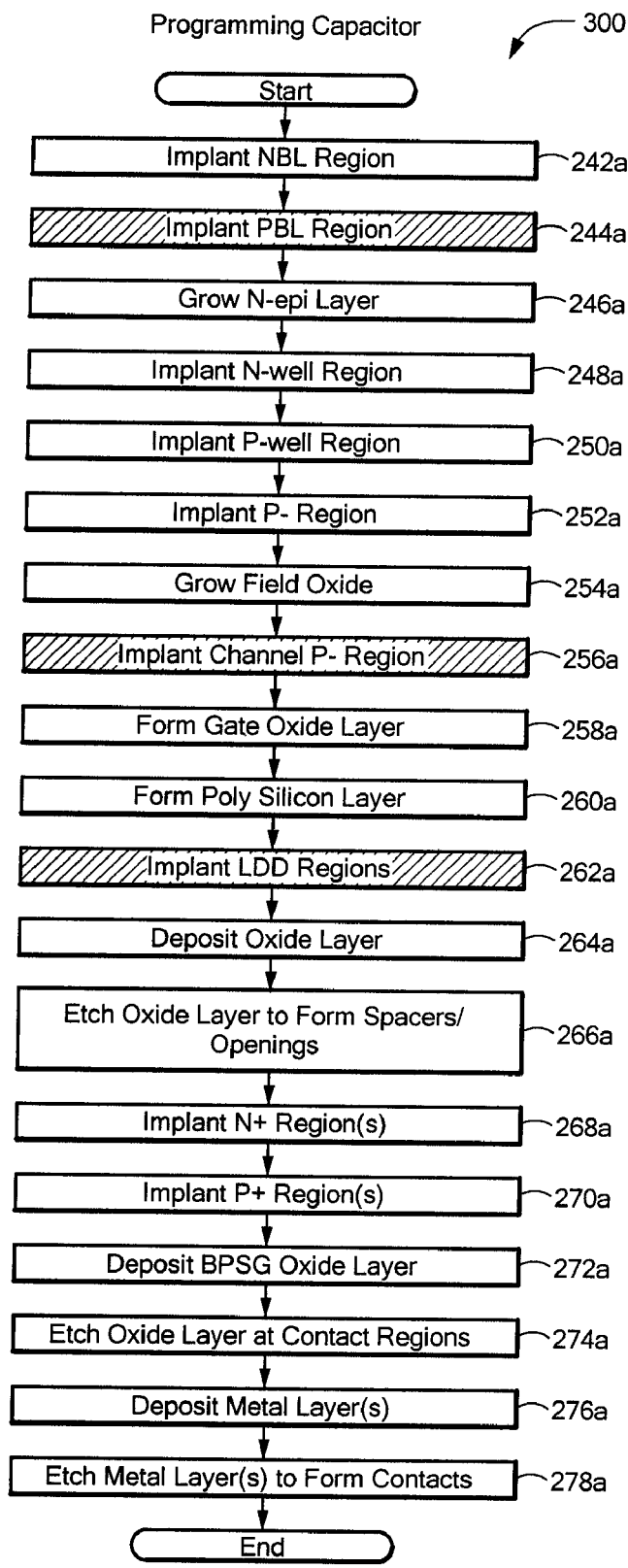
FIG. 6 is a flow chart showing a process of forming the programming capacitor of FIG. 1.
Figure 7:
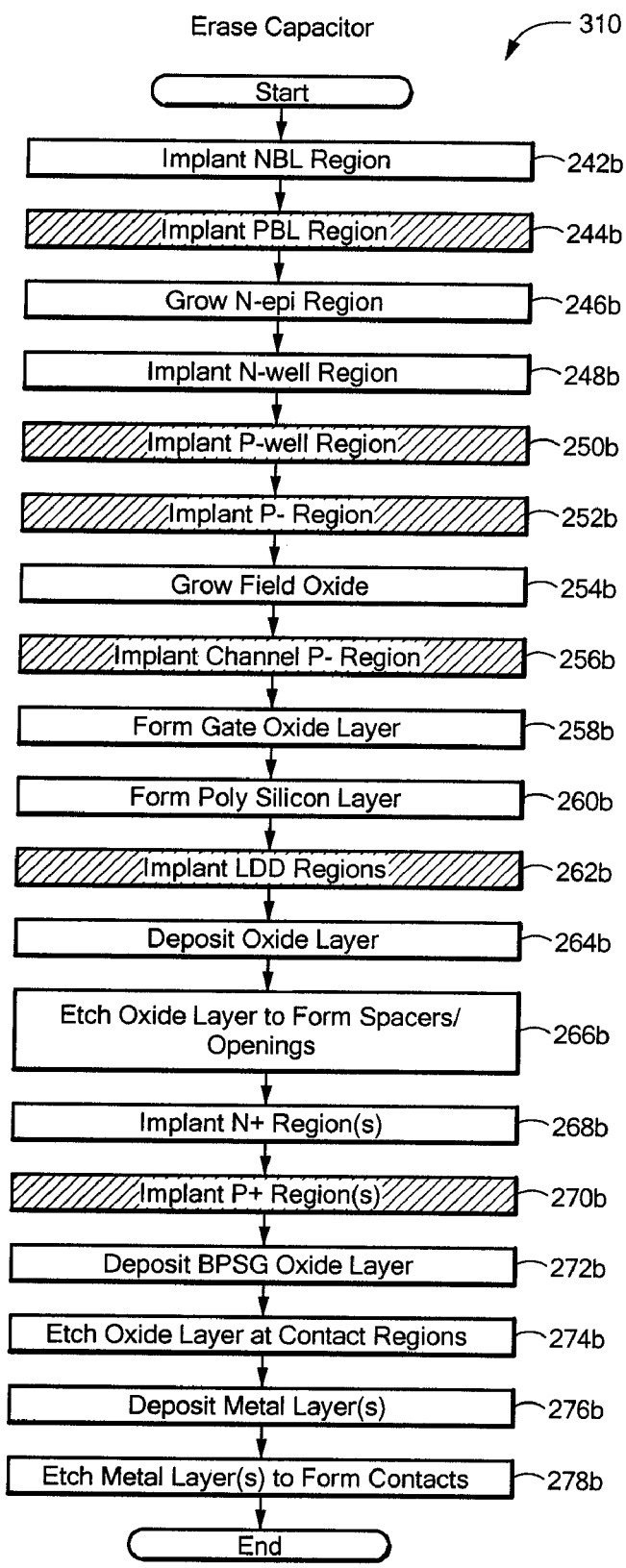
FIG. 7 is a flow chart showing a process of forming the erase capacitor of FIG. 1.

It should be appreciated that FIGS. 5-7 show flowcharts corresponding to the below contemplated techniques used to form the structures 10a-10c (FIG. 1), respectively. Rectangular elements (typified by element 242 in FIG. 5), herein denoted "process blocks," represent process steps.

It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

It will also be appreciated by those of ordinary skill in the art that steps have been omitted for clarity. For example, some steps associated with photoresist material deposition, masking, and removal, are omitted.

Referring now to FIGS. 5-7, FIG. 5 shows a method 240 that can be used to form the write/sense transistors 10a, 100 of FIGS. 1 and 2, respectively. FIG. 6 shows a method 300 that can be used to form the programming capacitors 10b, 150 of FIGS. 1 and 3 respectively. FIG. 7 shows a method 310 that can be used to form the erase capacitors 10c, 200 of FIGS. 1 and 4 respectively.

Each of FIGS. 5-7 includes one or more boxes that are cross-hatched. The cross-hatched boxes do not contribute to the particular method in which they appear. For example, the box 242 of FIG. 5 does not contribute to the method 240, which is used to form the write/sense transistors 10a, 100 of FIGS. 1 and 2. However, corresponding boxes 242a, 242b of FIGS. 6 and 7 do contribute to the methods 300, 310, respectively, which are used to form the programming capacitors 10b, 150 and the erase capacitors 10c, 200 of FIGS. 1, 3, and 4. The crosshatched boxes are merely included in FIGS. 5-7 to show an overall sequence of fabrication steps used to jointly form the write/sense transistors 10a, 100 the programming capacitors 10b, 150, and the erase capacitors 10c, 200.

Referring now to FIG. 5, an exemplary method 240 used to form a write/sense transistor, for example the write sense transistor 100 of FIG. 2, begins at block 242, which, as described above, does not contribute to the method 240, but which does contribute to the methods 300, 310 of FIGS. 6 and 7. Corresponding blocks 242a, 242b are discussed below.

At block 244, a PBL region is implanted in a substrate, for example, forming the PBL region 104 of FIG. 2.

At block 246 an N-epi layer, for example, the N-epi layer 106 of FIG. 2, is grown on the substrate. However, it will be recognized that the N-epi layer 106 does not explicitly form a part of the write/sense transistor 100 of FIG. 2, since it is overcome by the P-well region 108.

Block 248 does not contribute to the method 240, but does contribute to the methods 300, 310 of FIGS. 6 and 7. Corresponding blocks 248a, 248b are discussed below.

At block 250, a P-well region, for example, the P-well region 108 of FIG. 2, is implanted into the N-epi layer.

At block 252, a P-well region, for example, the P-well region 108 of FIG. 2 is implanted is implanted into the N-epi layer.

At block 254, field oxide, for example the field oxide 122a, 122b of FIG. 2, is grown on the N-epi layer, and, at block 256, a channel P-minus region, for example, the P-minus region 110 of FIG. 2, is implanted.

A gate oxide layer, for example, the gate oxide layer 116 of FIG. 2, is formed at block 258 and a polysilicon layer, for example, the polysilicon layer 118 of FIG. 2, is formed at block 260. The formation of these layers will be understood by those of ordinary skill in the art.

LDD regions, for example, the LDD regions 112a, 112b of FIG. 2 are implanted at block 262. At block 264 an oxide layer is deposited (for example, with a plasma enhanced chemical vapor deposition (PECVD) tetraethylorthosilicate (Si(OCH$_2$CH$_3$)$_4$) (TEOS) process) and at block 266, the oxide layer is etched to form spacers, for example, the spacers 120a, 120b of FIG. 2. At block 268, N-plus regions, for example, the N-plus regions 114a, 114b of FIG. 2, are implanted.

Block 270 does not contribute to the method 240, but does contribute to the methods 300, 310 of FIGS. 6 and 7. Corresponding blocks 270a, 270b are discussed below.

At block 272, a BPSG oxide layer, for example the BPSG oxide layer 124 of FIG. 2 is deposited, and at block 274, the BPSG oxide layer is etched to form vias, for example, the vias 126a, 126b of FIG. 2. At block 276, metal is deposited, which is etched at block 278 in order to form metal contacts, for example, metal contacts 128a, 128b of FIG. 2.

Referring now to FIG. 6, an exemplary method 300 used to form a programming capacitor, for example the programming capacitor 150 of FIG. 3, includes elements similar to those of FIG. 5, which are shown having similar reference designations but with suffix "a" to indicate that the same process elements are performed, but which result in different structures. The method 300 begins at block 242a, where an NBL region, for example, the NBL region 154 of FIG. 3, is implanted in a substrate, for example, the substrate 152 of FIG. 3. Block 244a does not contribute to the method 300, but does contribute to the method 240 of FIG. 5. Corresponding block 244 is discussed above.

At block 246a, an N-epi layer, for example, the N-epi layer 206 of FIG. 4, is grown on the substrate.

At block 248a, an N-well region, for example, the N-well region that is part of the N-well/N-epi region 52 of FIG. 1, is implanted into the N-epi region.

At block 250a, a P-well region, for example, the P-well region 158 of FIG. 3, is implanted into the N-epi layer, and, at block 252a, a P-minus region, for example, the P-minus region 158 of FIG. 3, is implanted into the N-epi layer. At block 254a, field oxide, for example the field oxide 168a, 168b of FIG. 3, is grown on the N-epi layer.

Block 256a does not contribute to the method 300, but does contribute to the method 300 of FIG. 5. Corresponding block 256 is discussed above.

An oxide layer, for example, the oxide layer 164 of FIG. 3, is formed at block 258a and a polysilicon layer, for example, the polysilicon layer 166 or FIG. 3, is formed at block 260a. The formation of these layers will be understood by those of ordinary skill in the art.

Block 262a does not contribute to the method 300, but does contribute to the method 300 of FIG. 5. Corresponding block 262 is discussed above.

At block 264a another oxide layer is deposited and at block 266a, the oxide layer is etched to form openings, for example, openings over the P-plus region 162 of FIG. 3, and over the N-plus region 150 of FIGS. 1 and 1A. At block 268a, an N-plus region, for example, the N-plus region 150 of FIG. 1 is implanted, and at block 270a a P-plus region, for example, the P-plus region 162 of FIG. 3, is implanted.

At block 272a, a BPSG oxide layer, for example the BPSG oxide layer 174 of FIG. 3, is deposited, and at block 274a, the BPSG oxide layer is etched to form vias, for example, the vias 172a, 172b of FIG. 3. At block 276a, metal is deposited, which is etched at block 278a in order to form a metal contact, for example, the metal contact 170 of FIG. 3.

Referring now to FIG. 7, an exemplary method 310 used to form an erase capacitor, for example the erase capacitor 200 of FIG. 4, includes elements similar to those of FIGS. 5 and 6, which are shown having similar reference designations but with suffix "b" to indicate that the same process is performed, but which results in different structures. The method 310 begins at block 242b, where an NBL region, for example, the NBL region 204 of FIG. 4, is implanted in a substrate, for example, the substrate 202 of FIG. 4. Block 244b does not contribute to the method 310, but does contribute to the method 240 of FIG. 5. Corresponding block 244 is discussed above.

At block 246b an N-epi layer, for example, the N-epi layer 206 of FIG. 4, is grown on the substrate. At block 248b, an N-well region, for example, the N-well region 208 of FIG. 4, is implanted into the N-epi layer.

Block 250b does not contribute to the method 310, but does contribute to the methods 240, 300 of FIGS. 5 and 6, respectively. Corresponding blocks 250, 250a are discussed above. Block 252b also does not contribute to the method 310, but does contribute to the method 300 of FIG. 6. Corresponding block 256a is discussed above.

At block 254a, field oxide, for example the field oxide 22a, 220b of FIG. 4, is grown on the N-epi layer.

Block 256b does not contribute to the method 310, but does contribute to the method 240 of FIG. 5. Corresponding block 256 is discussed above.

An oxide layer, for example, the oxide layer 218 of FIG. 4, is formed at block 258b and a polysilicon layer, for example, the polysilicon layer 214 of FIG. 4, is formed at block 260b. The formation of these layers will be understood by those of ordinary skill in the art.

Block 262b does not contribute to the method 310, but does contribute to the method 240 of FIG. 5. Corresponding block 262 is discussed above.

At block 264b another oxide layer is deposited and at block 266b, the oxide layer is etched to form spacers, for example, the spacers 216a, 216b of FIG. 4. At block 268b, N-plus regions, for example, the N-plus regions 210a, 210b of FIG. 4, are implanted.

Block 270b does not contribute to the method 310, but does contribute to the method 300 of FIG. 6. Corresponding block 270a is discussed above.

At block 272b, a BPSG oxide layer, for example the BPSG oxide layer 222 of FIG. 4, is deposited, and at block 274b, the BPSG oxide layer is etched to form a via, for example, the via 226 of FIG. 4. At block 276b, metal is deposited, which is etched at block 278b in order to form a metal contact, for example, the metal contact 224 of FIG. 4.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. An electrically erasable programmable read only (EEPROM) memory cell, comprising:
   a programming capacitor disposed on a substrate, wherein the programming capacitor comprises a capacitor deposited polysilicon layer disposed over an implanted P-well region; and
   a contact structure coupled to the implanted P-well region, the contact structure comprising:
      an implanted P-minus region coupled to the implanted P-well region;
      an implanted P-plus region coupled to the implanted P-minus region; and
      an implanted N-plus region coupled to the implanted P-plus region.

2. The memory cell of claim 1, further comprising:
   an NMOS transistor disposed on the substrate, coupled to the programming capacitor, enabled to transfer hot electrons to the programming capacitor deposited polysilicon layer, and enabled to sense the hot electrons.

3. The memory cell of claim 1, further comprising:
   an NMOS transistor disposed on the substrate, coupled to the programming capacitor, wherein the NMOS transistor comprises a transistor implanted P-minus region disposed in at least a gate region of the NMOS transistor.

4. The memory cell of claim 1, wherein the programming capacitor further comprises a field oxide layer, wherein the programming capacitor deposited polysilicon layer overlaps the field oxide layer.

5. The memory cell of claim 1, further comprising:
   an NMOS transistor disposed on the substrate and coupled to the programming capacitor, wherein the NMOS transistor comprises a transistor deposited polysilicon layer; and
   a polysilicon link coupling the programming capacitor deposited polysilicon layer with the transistor deposited polysilicon layer, wherein the programming capacitor deposited polysilicon layer is conjoined with the transistor deposited polysilicon layer by way of the polysilicon link in a single contiguous layer of polysilicon material.

6. The memory cell of claim 5, further comprising:
   an erase capacitor disposed on the substrate and coupled to the programming capacitor, wherein the erase capacitor comprises an erase capacitor deposited polysilicon layer; and
   a second polysilicon link coupling the erase capacitor deposited polysilicon layer with the programming capacitor deposited polysilicon layer, wherein the erase capacitor deposited polysilicon layer is conjoined with the programming capacitor deposited polysilicon layer by way of the second polysilicon link in the single contiguous layer of polysilicon material.

7. An electrically erasable programmable read only (EEPROM) memory cell, comprising:
   a programming capacitor disposed on a substrate, wherein the programming capacitor comprises a programming capacitor deposited polysilicon layer disposed over an implanted P-well region;
   an NMOS transistor disposed on the substrate, coupled to the programming capacitor, wherein the NMOS transistor comprises a transistor implanted P-minus region disposed in at least a gate region of the NMOS transistor; and
   a contact structure coupled to the implanted P-well region, the contact structure comprising:
      an implanted P-minus region coupled to the implanted P-well region;
      an implanted P-plus region coupled to the implanted P-minus region; and
      an implanted N-plus region coupled to the implanted P-plus region.

8. The memory cell of claim 7, wherein the NMOS transistor is enabled to transfer hot electrons to the programming capacitor deposited polysilicon layer and enabled to sense the hot electrons.

9. The memory cell of claim 7, wherein the programming capacitor comprises a programming capacitor deposited polysilicon layer and a field oxide layer, wherein the programming capacitor deposited polysilicon layer overlaps the field oxide layer.

10. The memory cell of claim 7, wherein the programming capacitor comprises a programming capacitor deposited polysilicon layer wherein the NMOS transistor comprises a transistor deposited polysilicon layer; and wherein the memory cell further comprises
   a polysilicon link coupling the programming capacitor deposited polysilicon layer with the transistor deposited polysilicon layer, wherein the programming capacitor deposited polysilicon layer is conjoined with the transistor deposited polysilicon layer by way of the polysilicon link in a single contiguous layer of polysilicon material.

11. The memory cell of claim 10, further comprising:
   an erase capacitor disposed on the substrate and coupled to the programming capacitor, wherein the erase capacitor comprises an erase capacitor deposited polysilicon layer; and
   a second polysilicon link coupling the erase capacitor deposited polysilicon layer with the programming capacitor deposited polysilicon layer, wherein the erase capacitor deposited polysilicon layer is conjoined with the programming capacitor deposited polysilicon layer by way of the second polysilicon link in the single contiguous layer of polysilicon material.

12. An electrically erasable programmable read only (EEPROM) memory cell, comprising:
 a programming capacitor disposed on a substrate, wherein the programming capacitor comprises a programming capacitor deposited polysilicon layer and a field oxide layer; and
 a contact structure coupled to the programming capacitor, wherein a portion of the field oxide layer is disposed over the contact structure, and wherein the programming capacitor deposited polysilicon layer overlaps at least the portion of the field oxide layer.

13. The memory cell of claim 12, wherein the programming capacitor further comprises an implanted P-well region disposed under the programming capacitor deposited polysilicon layer, wherein the memory cell further comprises a contact structure coupled to the implanted P-well region, the contact structure comprising:
 an implanted P-minus region coupled to the implanted P-well region;
 an implanted P-plus region coupled to the implanted P-minus region; and
 an implanted N-plus region coupled to the implanted P-plus region.

14. The memory cell of claim 12, further comprising:
 an NMOS transistor disposed on the substrate, coupled to the programming capacitor, enabled to transfer hot electrons to the programming capacitor deposited polysilicon layer, and enabled to sense the hot electrons.

15. The memory cell of claim 12, further comprising:
 an NMOS transistor disposed on the substrate and coupled to the programming capacitor, wherein the NMOS transistor comprises a transistor implanted P-minus region disposed in at least a gate region of the NMOS transistor.

16. The memory cell of claim 12, further comprising:
 an NMOS transistor disposed on the substrate and coupled to the programming capacitor, wherein the NMOS transistor comprises a transistor deposited polysilicon layer; and
 a polysilicon link coupling the programming capacitor deposited polysilicon layer with the transistor deposited polysilicon layer, wherein the programming capacitor deposited polysilicon layer is conjoined with the transistor deposited polysilicon layer by way of the polysilicon link in a single contiguous layer of polysilicon material.

17. The memory cell of claim 16, further comprising:
 an erase capacitor disposed on the substrate and coupled to the programming capacitor, wherein the erase capacitor comprises an erase capacitor deposited polysilicon layer; and
 a second polysilicon link coupling the erase capacitor deposited polysilicon layer with the programming capacitor deposited polysilicon layer, wherein the erase capacitor deposited polysilicon layer is conjoined with the programming capacitor deposited polysilicon layer by way of the second polysilicon link in the single contiguous layer of polysilicon material.

18. An electrically erasable programmable read only (EEPROM) memory cell, comprising:
 a programming capacitor disposed on a substrate and comprising a programming capacitor deposited polysilicon layer;
 an NMOS transistor disposed on the substrate and coupled to the programming capacitor, wherein the NMOS transistor comprises a transistor deposited polysilicon layer;
 an erase capacitor disposed on the substrate and coupled to the programming capacitor, wherein the erase capacitor comprises an erase capacitor deposited polysilicon layer, wherein the programming capacitor, the NMOS transistor, and the erase capacitor are electrically isolated from each other within the substrate;
 a first polysilicon link coupling the programming capacitor deposited polysilicon layer with the transistor deposited polysilicon layer; and
 a second polysilicon link coupling the erase capacitor deposited polysilicon layer with the programming capacitor deposited polysilicon layer wherein the programming capacitor deposited polysilicon layer is conjoined with the transistor deposited polysilicon layer and with the erase capacitor deposited polysilicon layer by way of the first and second polysilicon links in a single contiguous layer of polysilicon material.

19. The memory cell of claim 18, wherein the programming capacitor further comprises an implanted P-well region disposed under the programming capacitor deposited polysilicon layer, wherein the memory cell further comprises a contact structure coupled to the implanted P-well region, the contact structure comprising:
 an implanted P-minus region coupled to the implanted P-well region;
 an implanted P-plus region coupled to the implanted P-minus region; and
 an implanted N-plus region coupled to the implanted P-plus region.

20. The memory cell of claim 18, wherein the NMOS transistor is enabled to transfer hot electrons to the programming capacitor deposited polysilicon layer and enabled to sense the hot electrons.

21. The memory cell of claim 18, wherein that NMOS transistor comprises an implanted P-minus region disposed in at least a gate region of the NMOS transistor.

22. The memory cell of claim 18, wherein the programming capacitor further comprises a field oxide layer, wherein the programming capacitor deposited polysilicon layer overlaps the field oxide layer.

* * * * *

UNITED STATES PATENT AND TRADEMARK OFFICE
CERTIFICATE OF CORRECTION

PATENT NO. : 7,633,115 B2  Page 1 of 1
APPLICATION NO. : 11/550107
DATED : December 15, 2009
INVENTOR(S) : Yigong Wang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 469 days.

Signed and Sealed this

Second Day of November, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,633,115 B2 |
| APPLICATION NO. | : 11/550107 |
| DATED | : December 15, 2009 |
| INVENTOR(S) | : Yigong Wang |

It is certified that error appears in the above-identified patent and that said Letters Patent is hereby corrected as shown below:

Column 4, line 60 delete "region" and replace with --regions--

Column 5, line 60 delete "gate (For" and replace with --gate. For--

Column 6, line 14 delete "ensure" and replace with --ensures--

Column 6, line 23 delete "from" and replace with --form--

Column 6, line 29 delete "1A))" and replace with --1A)--

Column 6, line 61 delete "volts the" and replace with --volts, the--

Column 7, line 8 delete "payer" and replace with --layer--

Column 7, line 11 delete "dimension" and replace with --dimensions--

Column 7, line 22 delete "eighth" and replace with --eight--

Column 7, line 26 delete "thicknesses will" and replace with --thicknesses as will--

Column 7, line 66 delete "regions 44," and replace with --region 44,--

Column 8, line 4 delete "above described" and replace with --above-described--

Column 8, line 4-5 delete "above described" and replace with --above-described--

Column 8, line 11 delete "dimension" and replace with --dimensions--

Column 8, line 41 delete "dimension" and replace with --dimensions--

Column 9, line 15 delete "100 the" and replace with --100, the--

Column 9, line 18 delete "write sense" and replace with --write/sense--

Signed and Sealed this
Twenty-eighth Day of December, 2010

David J. Kappos
*Director of the United States Patent and Trademark Office*

CERTIFICATE OF CORRECTION (continued)
U.S. Pat. No. 7,633,115 B2

Column 9, line 36 delete "is implanted is implanted" and replace with --is implanted--

Column 12, line 52 delete "comprises" and replace with --comprises:--

Column 14, line 47 delete "that" and replace with --the--